US012770774B2

(12) United States Patent
Sun et al.

(10) Patent No.: US 12,770,774 B2
(45) Date of Patent: Oct. 20, 2026

(54) BI-DIRECTIONAL POWER CONVERTER MODULE

(71) Applicant: Navitas Semiconductor Limited, Dublin (IE)

(72) Inventors: Hao Sun, Shanghai City (CN); Zhen Zhou, Shanghai City (CN)

(73) Assignee: Navitas Semiconductor Limited, Dublin (IE)

( * ) Notice: Subject to any disclaimer, the term of this patent is extended or adjusted under 35 U.S.C. 154(b) by 0 days.

(21) Appl. No.: 18/590,850

(22) Filed: Feb. 28, 2024

(65) Prior Publication Data

US 2024/0203635 A1 Jun. 20, 2024

Related U.S. Application Data

(63) Continuation of application No. 18/057,692, filed on Nov. 21, 2022, now Pat. No. 11,935,681.

(30) Foreign Application Priority Data

| | | |
|---|---|---|
| Jul. 1, 2022 | (CN) | 202210777120.7 |
| Aug. 18, 2022 | (CN) | 202210993190.6 |
| Aug. 18, 2022 | (CN) | 202210995777.0 |

(51) Int. Cl.
*H02J 7/06* (2006.01)
*B60L 53/22* (2019.01)
(Continued)

(52) U.S. Cl.
CPC ............ *H01F 27/263* (2013.01); *B60L 53/22* (2019.02); *H01F 27/22* (2013.01); *H01F 27/306* (2013.01);
(Continued)

(58) Field of Classification Search
CPC ............ H02M 1/44; H02M 3/22; H02M 7/00; H02M 7/66; H05K 1/02; H05K 1/11; H05K 1/18
See application file for complete search history.

(56) References Cited

U.S. PATENT DOCUMENTS 6,424,544 B1 7/2002 Svardsjo
6,624,533 B1 * 9/2003 Swanson ................ H02P 9/307 307/64
(Continued)

OTHER PUBLICATIONS

Office Action (Non-Final Rejection) dated Mar. 13, 2025 for U.S. Appl. No. 18/057,682 (pp. 1-10).
(Continued)

*Primary Examiner* — Ryan Johnson
*Assistant Examiner* — Esayas G Yeshaw
(74) *Attorney, Agent, or Firm* — FisherBroyles, LLP

(57) ABSTRACT

A power converter comprises a chassis and an AC connector, a low-voltage DC connector and a high-voltage DC connector at an exterior surface of the chassis. An AC-DC converter circuit is positioned at least partially within the chassis and is coupled to the AC connector. A first converter circuit is positioned at least partially within the chassis and is coupled to the AC-DC converter circuit and to a high-voltage DC bus. The high-voltage DC bus is connected to the high-voltage DC connector. A second converter circuit is positioned at least partially within the chassis and is coupled to the high-voltage DC bus to a low-voltage DC bus. The low-voltage DC bus is connected to the low-voltage DC connector.

20 Claims, 5 Drawing Sheets

(51) Int. Cl.

| | |
|---|---|
| ***H01F 27/22*** | (2006.01) |
| ***H01F 27/26*** | (2006.01) |
| ***H01F 27/30*** | (2006.01) |
| ***H02M 1/42*** | (2007.01) |
| ***H02M 1/44*** | (2007.01) |
| ***H02M 3/22*** | (2006.01) |
| ***H02M 7/00*** | (2006.01) |
| ***H02M 7/66*** | (2006.01) |
| ***H05K 1/02*** | (2006.01) |
| ***H05K 1/11*** | (2006.01) |
| ***H05K 1/181*** | (2026.01) |

(52) U.S. Cl.
CPC ........... *H02M 1/4208* (2013.01); *H02M 1/44* (2013.01); *H02M 3/22* (2013.01); *H02M 7/003* (2013.01); *H02M 7/66* (2013.01); *H05K 1/0204* (2013.01); *H05K 1/0207* (2013.01); *H05K 1/119* (2013.01); *H05K 1/181* (2013.01); *B60L 2210/30* (2013.01); *B60L 2210/40* (2013.01)

(56) References Cited

U.S. PATENT DOCUMENTS

| | | | | |
|---|---|---|---|---|
| 7,236,041 | B2 | 6/2007 | Kim | |
| 7,764,521 | B2 | 7/2010 | Lin | |
| 7,791,910 | B2 | 9/2010 | Pwu | |
| 9,748,854 | B2 | 8/2017 | Li | |
| 10,056,844 | B2 | 8/2018 | Quaglino | |
| 10,554,140 | B1 | 2/2020 | Khamesra | |
| 10,651,746 | B2 | 5/2020 | Song | |
| 11,626,808 | B1 | 4/2023 | Vinciarelli | |
| 11,641,165 | B2 | 5/2023 | Zhang | |
| 2002/0140403 | A1* | 10/2002 | Reddy | H02J 9/062 320/162 |
| 2003/0193820 | A1 | 10/2003 | Nakayama | |
| 2003/0222503 | A1* | 12/2003 | Lam | H01R 29/00 307/38 |
| 2006/0018133 | A1 | 1/2006 | Hua | |
| 2010/0102327 | A1 | 4/2010 | Standing | |
| 2018/0287482 | A1* | 10/2018 | Schult | H02M 1/14 |
| 2018/0374802 | A1 | 12/2018 | Zheng | |
| 2019/0025351 | A1* | 1/2019 | Katrak | H01M 10/425 |
| 2019/0386546 | A1 | 12/2019 | Iwagami | |
| 2020/0156476 | A1* | 5/2020 | Suzuki | B60L 3/0092 |
| 2020/0247218 | A1* | 8/2020 | Zheng | H02J 7/02 |
| 2021/0045574 | A1 | 2/2021 | Eno | |
| 2022/0020678 | A1 | 1/2022 | Matsubara | |
| 2022/0103003 | A1* | 3/2022 | Sahoo | H02J 1/02 |
| 2022/0159839 | A1 | 5/2022 | Cho | |
| 2022/0271683 | A1* | 8/2022 | Houda | H05K 7/1427 |
| 2022/0396167 | A1* | 12/2022 | Sharifipour | B60L 53/51 |
| 2023/0070930 | A1* | 3/2023 | Gu | H02M 1/4233 |
| 2024/0195312 | A1 | 6/2024 | Huang | |
| 2024/0195313 | A1 | 6/2024 | Huang | |
| 2025/0202374 | A1* | 6/2025 | Miyazaki | H02M 1/008 |

OTHER PUBLICATIONS

Office Action (Non-Final Rejection) dated Aug. 27, 2025 for U.S. Appl. No. 18/531,617 (pp. 1-12).

Office Action (Non-Final Rejection) dated Aug. 27, 2025 for U.S. Appl. No. 18/531,619 (pp. 1-14).

Action (Notice of Allowance and Fees Due (PTOL-85)) dated Jul. 11, 2025 for U.S. Appl. No. 18/057,682 (pp. 1-5).

* cited by examiner

BI-DIRECTIONAL POWER CONVERTER MODULE

CROSS-REFERENCES TO OTHER APPLICATIONS

This application is a continuation of U.S. application Ser. No. 18/057,692, filed Nov. 21, 2022, entitled "BI-DIRECTIONAL POWER CONVERTER MODULE, which claims priority to the following commonly-assigned Chinese provisional patent applications: Serial No. 202210995777.0, filed on Aug. 18, 2022, Serial No. 202210777120.7, filed on Jul. 1, 2022, and Serial No. 202210993190.6, filed on Aug. 18, 2022, which are each hereby incorporated by reference in their entirety for all purposes. This application is also related to the following concurrently-filed and commonly-assigned U.S. patent applications: Ser. No. 18/057,682, entitled "INTEGRATED VOLTAGE REGULATOR," filed Nov. 21, 2022, and Ser. No. 18/057,697, entitled "INTEGRATED TRANSFORMER," filed Nov. 21, 2022, which are also hereby incorporated by reference in their entirety for all purposes.

FIELD

The described embodiments relate generally to power conversion modules. More specifically, the described embodiments relate to an on-board bi-directional power converter module for an electric vehicle.

BACKGROUND

Electric vehicles operate using various voltages and forms of power (e.g., AC and DC power). For example, they are typically charged using AC power and they typically store power in both high-voltage and low-voltage battery packs that operate both high-current propulsion systems and low-current operating systems. This arrangement requires multiple power conversion circuits that are distributed across the vehicle. New methods of efficiently integrating the various power conversion circuits into a space-efficient and cost-efficient integrated power conversion system are needed.

SUMMARY

In some embodiments an efficiently integrated power converter is presented. The converter includes a chassis with an AC connector, a low voltage DC connector and a high voltage DC connector on the exterior of the chassis. The power converter has an AC to DC converter circuit that is positioned at least partially within the chassis and coupled to the AC connector. There is a first converter circuit positioned at least partially within the chassis, coupled to the AC-DC converter circuit and coupled to a high-voltage DC bus, wherein the high-voltage DC bus is connected to the high-voltage DC connector.

In some embodiments a second converter circuit is positioned at least partially within the chassis, coupled to the high-voltage DC bus and coupled to a low-voltage DC bus, wherein the low-voltage DC bus is connected to the low-voltage DC connector. In some embodiments the first converter has a high voltage isolation transformer. The first converter can receive power from the high voltage DC bus and deliver power to the low voltage DC bus as well as receive power from the low voltage DC bus and deliver power to the high voltage DC bus. In some embodiments the first converter circuit receives power form the AC-DC converter and delivers power to the high voltage DC bus and receives power from the high voltage DC bus and delivers power to AC-DC converter circuit.

In some embodiments the power converter includes an AC filter with a power factor correction circuit coupled to the AC connector. In some embodiments it also includes a high voltage electromagnetic interference filter and a low voltage electromagnetic interference filter positioned between the second converter and the low voltage DC bus. In some embodiments the AC-DC power converter also converts DC power to AC power. In some embodiments the power converter comprises an inlet cooling fluid port, an outlet cooling fluid port and a communications connector mounted to the exterior surface. In various embodiments the chassis further comprises a coolant channel disposed within a wall, wherein the wall is defined by an inside surface opposite an outside surface. In some embodiments a full-bridge converter assembly is disposed on and is thermally coupled to the outside surface of the wall. In various embodiments a converter circuit is disposed on and is thermally coupled to the inside surface of the wall.

In some embodiments a power converter module is disclosed that comprises a chassis that is arranged to be attached to a vehicle with an exterior surface, a high-voltage DC connector arranged to be electrically connected to a high-voltage DC bus of the vehicle and a low-voltage DC connector arranged to be electrically connected to a low-voltage DC bus of the vehicle. An AC-DC converter circuit positioned within the chassis is coupled to the AC connector and a first converter circuit positioned within the chassis and is electrically connected to the high-voltage DC connector. The first converter circuit is arranged to receive power from the high-voltage DC bus and to transfer power to the high-voltage DC bus. In some embodiments a second converter circuit positioned within the chassis and electrically connected to the low-voltage DC connector.

In some embodiments the second converter circuit can be arranged to receive power from the low-voltage DC bus and to transfer power to the low-voltage DC bus. The first converter includes a high-voltage isolation transformer. In some embodiments the second converter circuit is further configured to receive power from the high-voltage DC bus and deliver power to the low-voltage DC bus. In some embodiments the first converter circuit is further configured to receive power from the high-voltage DC bus and deliver power to the AC-DC converter circuit. An AC filter and a power factor correction circuit may be coupled to the AC connector.

In some embodiments a method of converting power within a module is disclosed. The method comprising forming a chassis of the module attaching an AC connector to an exterior surface of the module, the AC connector arranged to be electrically connected to an AC bus. Also disclosed is attaching a high-voltage DC connector to the exterior surface of the module, the high-voltage DC connector arranged to be electrically connected to a high-voltage DC bus and attaching a low-voltage DC connector to the exterior surface of the module, the low-voltage DC connector arranged to be electrically connected to a low-voltage DC bus. The method further includes positioning an AC-DC converter circuit within the chassis and coupling the AC-DC converter circuit to the AC connector and positioning a first converter circuit within the chassis and coupling the first converter circuit to the high-voltage DC connector, the first converter circuit arranged to receive power from the high-voltage DC bus and to transfer power to the high-voltage DC bus.

In some embodiments the method includes positioning a second converter circuit within the chassis and coupling the second converter circuit to the low-voltage DC connector, the second converter circuit arranged to receive power from the low-voltage DC bus and to transfer power to the low-voltage DC bus. The first converter may include a high voltage isolation transformer. The second converter circuit, in embodiments is configured to receive power from the high voltage DC bus and deliver power to the low voltage DC bus.

DETAILED DESCRIPTION

Figure 1:
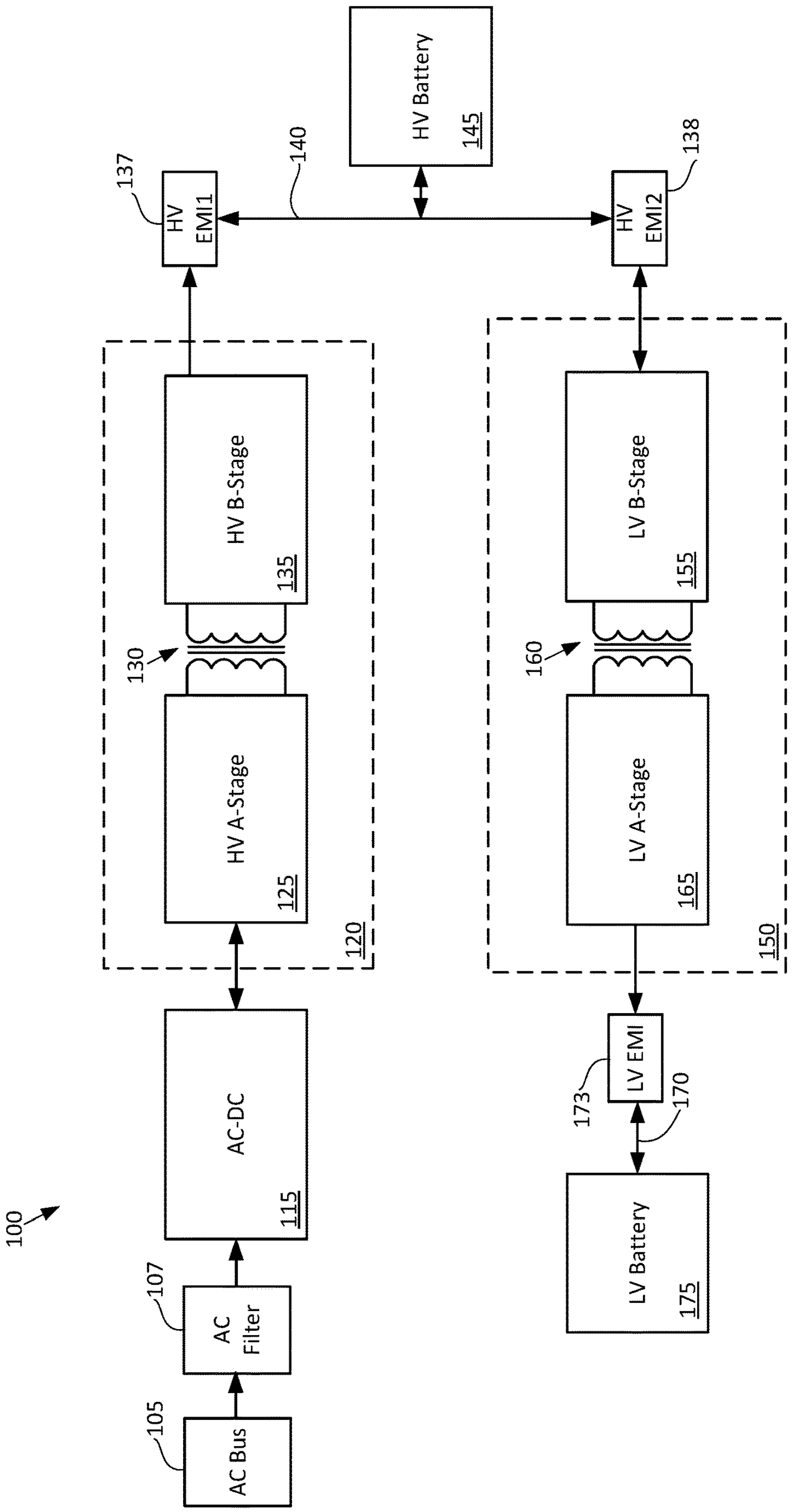
FIG. 1 illustrates a simplified block diagram of a bi-directional power converter circuit, according to some embodiments of the disclosure.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word “example” or “exemplary” is used herein to mean “serving as an example, instance, or illustration.” Any embodiment or design described herein as “exemplary” or “example” is not necessarily to be construed as preferred or advantageous over other embodiments or designs.

Some embodiments of the disclosure relate to on-board bi-directional power converters and may be particularly useful for the conversion of power within electric vehicles. For example, in one embodiment the on-board bi-directional power converter can be used to receive power from an AC outlet and deliver DC power to the electric vehicle’s on-board high-voltage battery pack. The bi-directional power converter can also work in reverse and be used to receive DC power from the on-board high-voltage battery pack and deliver AC power to an AC receptacle on the vehicle. In various embodiments the bi-directional power converter may also receive AC power from the AC outlet and convert it to low-voltage DC power that can be used for charging a low voltage battery (e.g., 12 VDC) that operates systems on-board the electric vehicle. In some embodiments the bi-directional power converter can receive high-voltage DC power from the high-voltage on-board battery pack and convert it to low-voltage DC power that can also be used for the low-voltage battery and low-voltage systems on-board the electric vehicle. These and various other features of on-board bi-directional power converters are described in more detail below. In one example embodiment a high-frequency on-board bi-directional power converter capable of delivering 6.6 KW of power to the high-voltage battery pack and a bi-directional low-voltage DC/DC converter capable of delivering 3 KW to the low-voltage battery pack and/or to on-board systems are integrated within a unitary chassis (e.g., module).

In order to better appreciate the features and aspects of on-board bi-directional power converters according to the present disclosure, further context for the disclosure is provided in the following section by discussing one particular implementation of an on-board bi-directional power converter. These embodiments are for example only and other embodiments can have additional or fewer circuits, a different physical geometry or other configurations.

FIG. 1 illustrates a simplified block diagram of an on-board isolated bi-directional power converter circuit, according to some embodiments of the disclosure. As shown in FIG. 1, converter circuit 100 can operate bi-directionally in numerous modes including but not limited to:

- Convert AC input power (e.g., 90-265 VAC) from AC Bus 105 (e.g., residential receptacle) to high-voltage DC power (e.g., 100-1000 VDC) that can charge high-voltage battery 145
- Convert AC input power from AC Bus 105 (e.g., residential receptacle) to low-voltage DC power (e.g., 9-60 VDC) that can charge a low-voltage battery 175
- Convert high-voltage DC power from high-voltage battery 145 to AC power (e.g., 90-265 VAC) supplied to AC Bus 105
- Convert high-voltage DC power from high-voltage battery 145 to low-voltage DC power used to charge low-voltage battery 175
- Convert low-voltage DC power from low-voltage battery 175 to high-voltage DC power used to charge high-voltage battery 145
- Convert low-voltage DC power from low-voltage battery 175 to AC power supplied to AC Bus 105

Converter circuit 100 may perform any of these operations automatically based on predetermined programming or the operation of the converter circuit may be controlled by an external controller (not shown in FIG. 1). Various example operations of converter circuit 100 will now be described starting with the AC to DC conversion process and ending with the DC to AC conversion process, however the converter circuit is not limited to the operations described and may perform other suitable operations.

Converter circuit 100 includes AC Bus 105 that can receive AC input power from a standard wall receptacle or other suitable receptacle connector. An AC Filter 107 can filter noise off of the incoming AC power. An AC-DC converter circuit 115 receives the AC power from AC Filter 107 and converts the AC power to DC power. AC-DC converter circuit 115 also includes a power factor correction (PFC) circuit that adjusts the power factor of the incoming AC power as needed (e.g., to be close to unity). The DC power is received by first converter circuit 120 that includes an HV A-Stage circuit 125 isolated from an HV B-Stage circuit 135 by a high-voltage transformer 130. In this mode of operation, HV A-Stage circuit 125 operates as a DC to AC converter, receiving the DC power from AC-DC circuit 115 and converting it to AC power delivered to high-voltage transformer 130. High-voltage transformer can be an isolation transformer and can deliver AC power to HV B-Stage circuit 135. In this mode of operation HV B-Stage circuit 135 can function as an AC to DC converter and can deliver DC power to high-voltage DC bus 140 via a high-voltage electromagnetic interference filter (HV EMI1) 137 that filters noise off of the delivered high-voltage power. High-voltage DC bus 140 can be used to charge high-voltage battery (HV Battery) 145 and/or to provide power to second converter circuit 150 to charge low-voltage battery (LV Battery) 175. High-voltage DC bus 140 can also be used to supply power to one or more vehicle systems including the main electrical motors used for propulsion, sometimes called a traction inverter circuit.

More, specifically, second converter circuit 150 includes an LV A-Stage circuit 165 isolated from an LV B-Stage circuit 155 by a low-voltage transformer 160. In this mode of operation LV B-Stage circuit 155 can receive DC power from high-voltage DC bus 140 and convert it to AC power delivered to low-voltage transformer 160. Low-voltage transformer 160 can be an isolation transformer and can deliver AC power to LV A-Stage circuit 165. In this mode of operation, LV A-Stage circuit 165 may function as an AC to DC converter, receiving AC power from low-voltage transformer 160 and delivering low voltage DC power to low-voltage DC bus 170 via a low-voltage electromagnetic interference filter (LV EMI) 173 that filters noise off of the delivered low-voltage DC power. Low-voltage DC bus 170 can be used to charge low voltage battery (LV Battery) 175 and/or power other low-voltage circuits on-board the vehicle.

In a reverse mode of operation, LV Battery 175 can supply low-voltage DC power to low-voltage DC bus 170 which can be received by second converter circuit 150. In this mode of operation, LV A-Stage circuit 165 can function as a DC to AC converter and convert the low-voltage DC power to AC power delivered to low-voltage transformer 160. In this mode of operation, LV B-Stage circuit 155 can receive AC power from low-voltage transformer 160 and can convert it to high-voltage DC power delivered to high-voltage DC bus 140 via High-Voltage Electromagnetic Interference Filter circuit 2 (HV EMI2) 138. The high-voltage DC power on high-voltage DC bus 140 can be used to charge HV Battery 145 and/or to operate first converter circuit 120. More specifically, in this mode of operation HV-B Stage circuit can function as a DC to AC converter circuit, converting high-voltage DC power to AC power delivered to high-voltage transformer 130. HV A-Stage circuit can receive AC power from high-voltage transformer 130 and function as an AC to DC converter delivering DC power to AC-DC converter circuit 115. In this mode of operation, AC-DC converter circuit 115 can function as a DC to AC converter and deliver AC power to AC Bus 105. AC Bus 105 can be coupled to a receptacle connector that is positioned on the vehicle and used to power auxiliary systems via an AC receptacle connector (e.g., a vacuum cleaner, an AC charger for an electronic device, etc.).

In another mode of operation HV Battery 145 can deliver high-voltage DC power to high-voltage DC bus 140 which can be used by first converter circuit 120 to provide AC power at AC Bus 105, and/or can be used by second converter circuit 150 to provide low-voltage DC power to charge LV Battery 175.

Thus, depending on the needs of the system and/or the user, converter circuit 100 can transfer power to and from high-voltage and low-voltage batteries, as well as convert power between AC and DC as needed. More specifically, converter circuit 100 provides an integrated flexible and efficient method of on-board conversion of AC power to low-voltage DC power and/or to high voltage DC power, conversion of low-voltage DC power to AC power and/or to high-voltage DC power, and conversion of high-voltage DC power to AC power and/or to low-voltage DC power.

Figure 2B:
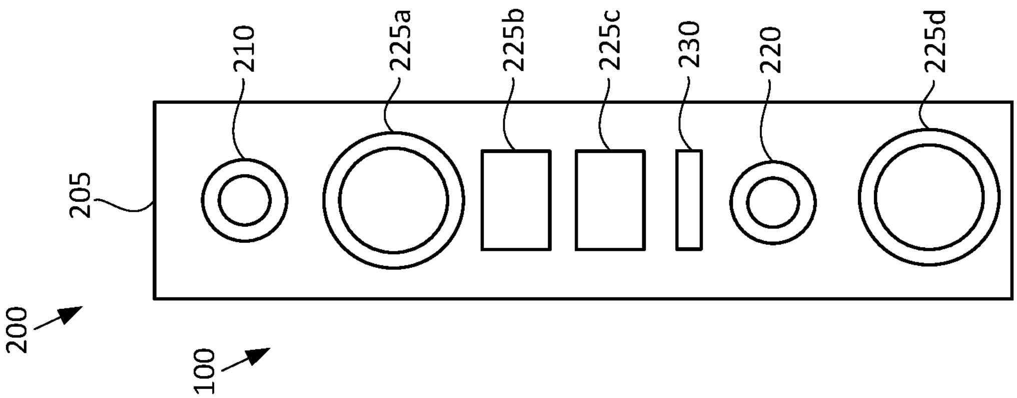
FIG. 2B illustrates a simplified side view of the bi-directional power converter module shown in FIG. 2A.
Figure 2A:
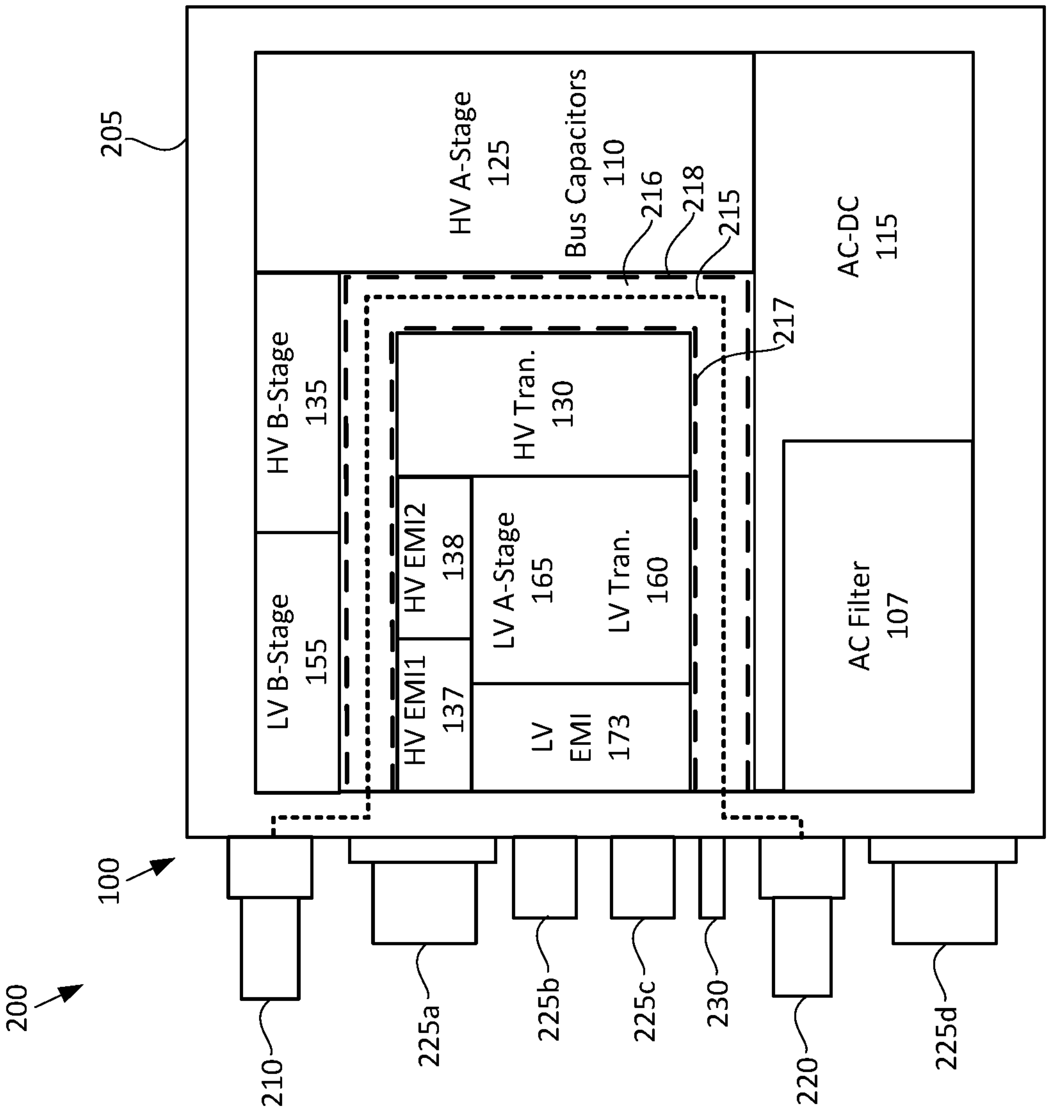
FIG. 2A illustrates a simplified plan view of a bi-directional power converter module that includes the power converter circuit of FIG. 1.

FIG. 2A illustrates a simplified plan view and FIG. 2B illustrates a simplified side view of a bi-directional power converter module 200 that includes bi-directional power converter circuit 100 of FIG. 1, according to embodiments of the disclosure. As shown in FIG. 2A, module 200 includes a housing 205 within which converter circuit 100 is positioned and coupled to a plurality of electrical connectors 225, described in more detail below. Converter module 200 may also include a coolant inlet port 210 coupled by a fluid channel 215 to a coolant output port 220 and a data communications port 230 that provides bi-directional communications between the components of converter circuit 100 and external circuitry (e.g., vehicle circuitry).

Fluid channel 215 may be routed through housing 205 in any suitable manner (e.g., in a rectangular, serpentine, etc. pattern) and may be configured to remove heat from the components of converter circuit 100. In some embodiments, housing 205 is formed from aluminum and includes one or more passages that form fluid channel 215. In various embodiments fluid channel 215 is in a "U" shape and may be formed within a wall 216 defined by inner surface 217 and outer surface 218. More specifically, in some embodiments wall 216 may extend from a central region of housing 205 vertically (e.g., out of the paper as shown in FIG. 2A) as a fin-type structure such that one or more electronic components can be attached to the wall. In one embodiment full-bridge converter subassembly 500 of FIGS. 5A and 5B can be attached to wall 216. More specifically, spring-loaded clip 530 can be attached to outer surface 218 of wall 216 and arranged to apply compressive force to semiconductor devices 510*a*-510*d*, which forces circuit board 515 in thermal contact with substrate 520 which in turn holds the substrate in thermal contact with the wall. This arrangement may provide efficient cooling for semiconductor devices 510*a*-510*d*. In some embodiments one or more components, e.g., converter assembly 400 of FIG. 4 may be thermally coupled to inner surface 217 of wall 216 with a thermally conductive material such as, for example, a thermally conductive potting material. Converter module 200 may be mounted to a vehicle, electrically coupled to the vehicle via electrical connectors 225 and fluidly coupled to the vehicle (e.g., to a radiator) via inlet port 210 and outlet port 220.

In some embodiments AC power (e.g., from AC Bus 105 (see FIG. 1) may enter AC bus connector 225*d*. Incoming AC power is filtered by AC Filter circuit 107 and delivered to a AC-DC circuit 115 that converts the AC power into DC power that may be coupled to one or more Bus Capacitors 110. The AC-DC circuit can include a PFC circuit that compensates for any lagging current by for example, connecting one or more capacitors to the incoming AC power. A sufficient capacitance can be connected so that the power factor is adjusted to be close to unity.

The DC power is received by HV A-Stage circuit 125 that operates as a DC to AC converter, receiving the DC power from AC-DC circuit 115 and converting it to AC power delivered to high-voltage transformer 130. High-voltage transformer 130 can be an isolation transformer and can deliver AC power to HV B-Stage circuit 135. In this mode of operation HV B-Stage circuit 135 can function as an AC to DC converter and can deliver DC power to high-voltage DC connector 225*a* via HV EMI1 circuit 137 that filters noise off of the delivered high-voltage power. High-voltage DC connector 225*a* can be used to couple the filtered high-voltage DC power to high-voltage DC bus 140 (see FIG. 1) that can be used to charge high-voltage battery 145 (see FIG. 1) and/or to provide power to second converter circuit 150 (see FIG. 1). Second converter circuit 150 (see FIG. 1) includes LV A-Stage circuit 165 isolated from an LV B-Stage circuit 155 by a low-voltage transformer 160.

More specifically, in this mode of operation LV B-Stage circuit 155 can receive DC power from high-voltage DC bus 140 via high voltage-DC connector 225*a* (and/or an internal connection within converter module 200) and convert it to AC power delivered to low-voltage transformer 160. Low-voltage transformer 160 can be an isolation transformer and can deliver AC power to LV A-Stage circuit 165. In this mode of operation, LV A-Stage circuit 165 may function as an AC to DC converter receiving AC power from low-voltage transformer 160 and delivering low voltage DC power to low-voltage DC connectors 225*b*, 225*c* (e.g., positive and negative connectors) via low-voltage electromagnetic interference filter (LV EMI) 173 that filters noise off of the delivered low-voltage DC power. Low-voltage connectors 225*b*, 225*c* can be coupled to low-voltage DC bus 170 (see FIG. 1) which can be used to charge low voltage battery (LV Battery) 175 and/or power other low-voltage circuits on-board the vehicle.

In a reverse mode of operation, LV Battery 175 (see FIG. 1) can supply low-voltage DC power to low-voltage DC bus 170 which can be received by second converter circuit 150 via low-voltage connectors 225*b*, 225*c*. In this mode of operation, LV A-Stage circuit 165 can function as a DC to AC converter and convert the low-voltage DC power to AC power delivered to low-voltage transformer 160. In this mode of operation, LV B-Stage circuit 155 can receive AC power from low-voltage transformer 160 and can convert it to high-voltage DC power delivered to high-voltage DC bus 140 (see FIG. 1) via HV EMI2 filter 138 and high-voltage DC connector 225*a*. The high-voltage DC power on high-voltage DC bus 140 (see FIG. 1) can be used to charge HV Battery 145 and/or to operate first converter circuit 120 (see FIG. 1). More specifically, in this mode of operation HV-B Stage circuit 135 can function as a DC to AC converter circuit, converting high-voltage DC power to AC power delivered to high-voltage transformer 130. HV A-Stage circuit can receive AC power from high-voltage transformer 130 and function as an AC to DC converter delivering DC power to AC-DC converter circuit 115. In this mode of operation, AC-DC converter circuit 115 can function as a DC to AC converter and deliver AC power to an AC bus via AC bus connector 225*d*.

In another mode of operation HV Battery 145 (see FIG. 1) can deliver high-voltage DC power to high voltage DC connector 225*a* via high-voltage DC bus 140 (see FIG. 1). The high-voltage DC power can be used by first converter circuit 120 (see FIG. 1) to provide AC power at AC bus connector 225*d*, and/or can be used by second converter circuit 150 (see FIG. 1) to provide low-voltage DC power to charge LV Battery 175 via low-voltage DC connectors 225*b*, 225*c*.

Converter circuit 100 is formed from any suitable number of and configuration of active and passive electrical components including but not limited to silicon and/or gallium nitride-based power transistors, diodes, controllers, capacitors, resistors, inductors and the like. In some embodiments the active and passive electrical components can be disposed on and/or integrated within one or more substrates that are mounted within housing 205. As used herein, substrates may include organic laminates with metallized circuitry and ceramic laminates (e.g., insulated metal substrate (IMS), and direct-bonded copper (DBC). In some embodiments the electrical components may be positioned such that they are flush with housing 205 and housing covers (not shown in FIGS. 2A, 2B) may be attached to the housing to create a sealed enclosure.

In some embodiments one or more of the electrical components of converter circuit 100 are potted (e.g., at least partially encapsulated) in thermally conductive material that is in contact with housing 205 and/or the substrate(s) to improve the transfer of heat from the component to the coolant flowing in coolant channel 215. In various embodiments one or more of the electrical components may be thermally coupled to housing 205 with a thermal interface material or other thermally conductive medium. In some embodiments, high-voltage transformer 130, low-voltage transformer 160 and various other electrical components may be thermally coupled to housing 205.

Figure 3:
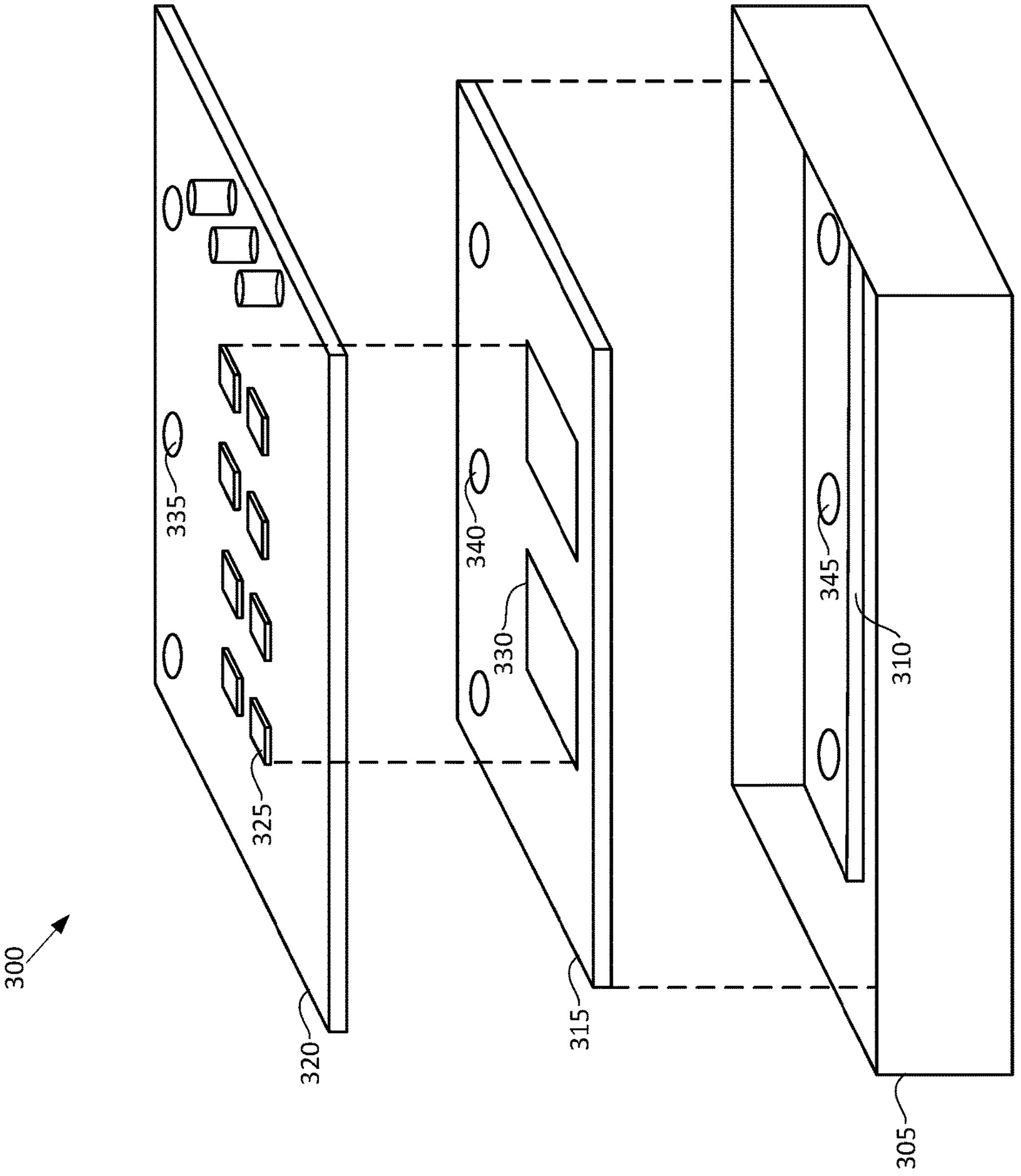
FIG. 3 illustrates a simplified exploded view of a power converter module, according to embodiments of the disclosure.

FIG. 3 illustrates a simplified exploded view of a converter module 300 that may be similar to convert module 200 shown in FIG. 2. As shown in FIG. 3, converter module 300 includes a housing 305 that may include a boss 310 that can be thermally coupled to a coolant channel (not shown in FIG. 3). A cooling plate 315 may be formed from a metal or other material having a relatively high thermal conductivity (e.g., aluminum) and may be thermally coupled to boss 310 via a thermal interface material and one or more fasteners. In some embodiments cooling plate 315 may comprise a thermally conductive electrical routing structure such as for example direct-bonded copper (DBC), insulated metal substrate (IMS) or the like.

A circuit board 320 or other electrical routing structure includes a plurality of power electronic devices 325 that are thermally and electrically coupled to the circuit board. In some embodiments circuit board 320 may include one or more thermally conductive inlays (not shown in FIG. 3) that efficiently transfer thermal energy through the circuit board to cooling plate 315. Circuit board 320 may be thermally and mechanically coupled to a cooling plate 315 with fasteners and one or more thermal interface materials 330. In some embodiments one or more fasteners may pass through circuit board apertures 335, through cooling plate apertures 340 and be secured to boss mounting holes 345 enabling thermal energy from plurality of power electronic devices 325 to be coupled to boss 310.

Figure 4:
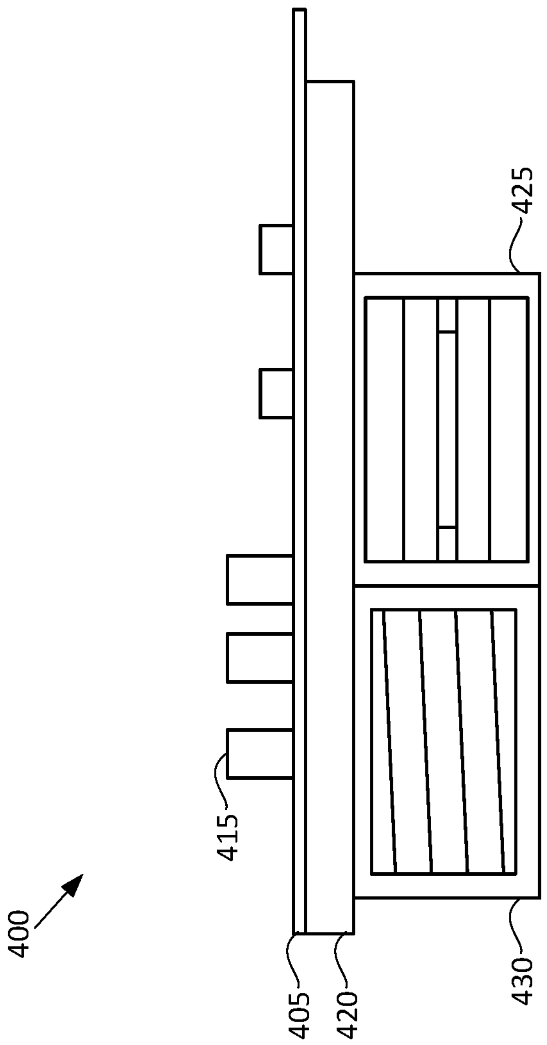
FIG. 4 illustrates a simplified side view of a low-voltage DC to DC converter assembly that can be positioned within a converter module, according to embodiments of the disclosure.

FIG. 4 illustrates a simplified side view of an example low-voltage DC to DC converter assembly that can be positioned within a converter module, according to some embodiments of the disclosure. In some embodiments, low-voltage DC to DC converter assembly 400 can be disposed within converter module 200 of FIGS. 2A and 2B or converter module 300 of FIG. 3. As shown in FIG. 4, low-voltage DC to DC converter assembly 400 can be a separate subassembly that is assembled and tested before integration into a converter module. Converter assembly 400 may include a circuit board 405 that includes one or more active and passive electronic components 415 that are thermally and electrically coupled to the circuit board. Circuit board 405 may be thermally coupled to a cooling plate 420. Cooling plate 420 may be formed from a metal or other material having a relatively high thermal conductivity (e.g., aluminum) and may be thermally coupled to a boss or other structure of a module housing (e.g., housing 305 of FIG. 3) via a thermal interface material and one or more fasteners. In some embodiments cooling plate 420 may comprise a thermally conductive electrical routing structure such as for example direct-bonded copper (DBC), insulated metal substrate (IMS) or the like.

In some embodiments converter assembly 400 can include a low-voltage A-Stage circuit (e.g., 165 in FIG. 1), a low-voltage transformer 425 (e.g., 160 in FIG. 1) and a low-voltage B-Stage circuit (e.g., 155 in FIG. 1). In some embodiments converter assembly 400 may also include an inductor 430 and various other passive and/or active components. Each electrical component, transformer 425 and inductor 430 may be thermally coupled to cooling plate 420 to efficiently couple heat out of the components and to a fluid channel (e.g., channel 215 in FIG. 2) to transfer heat out of the converter module.

Figure 5A:
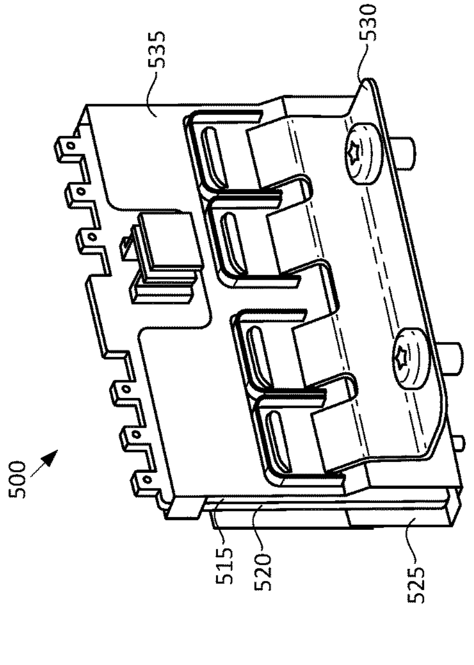
FIG. 5A illustrates a simplified isometric view a full-bridge converter subassembly that can be positioned within a converter module, according to embodiments of the disclosure.
Figure 5B:
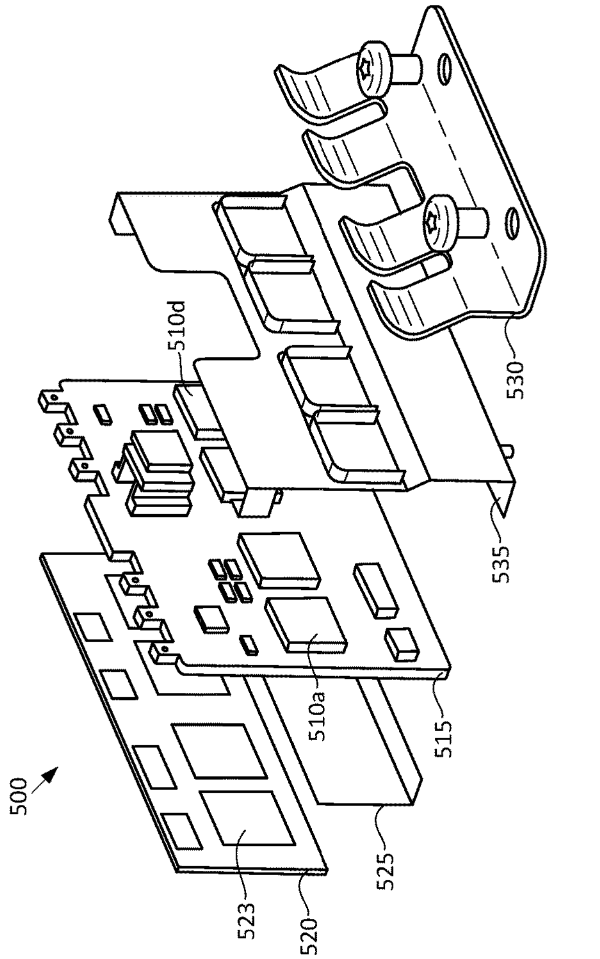
FIG. 5B illustrates a simplified isometric exploded view the full-bridge converter subassembly that is shown in FIG. 5A.

FIG. 5A illustrates a simplified assembled view and FIG. 5B illustrates a simplified exploded view of a full-bridge converter subassembly that can be positioned within a converter module, according to some embodiments of the disclosure. In some embodiments, full-bridge converter subassembly 500 can be disposed within converter module 200 of FIGS. 2A and 2B or within converter module 300 of FIG. 3. In some embodiments, full-bridge converter subassembly 500 can be used as HV-A Stage circuit 125 (see FIG. 1), HV-B Stage circuit 135, LV B-Stage circuit 155 and/or AC-DC circuit 115. As shown in FIGS. 5A and 5B, full-bridge converter subassembly 500 can be a separate subassembly that is assembled and tested before integration into a converter module. Full-bridge converter subassembly 500 may include four power semiconductor devices 510*a*-510*d* that are attached to a circuit board 515 and electrically coupled to form a full-bridge circuit. In some embodiments semiconductor devices 510*a*-510*d* are GaN power HEMTs, however in other embodiments they can be silicon, silicon-carbide or other suitable devices.

Circuit board 515 can be any suitable type of single or multilayer electrical routing structure including organic or ceramic based insulative layers. In some embodiments circuit board 515 includes thermal inlays (not shown in FIGS. 5A and 5B) positioned under each respective semiconductor device 510*a*-510*d* and that extend through an entire thickness of circuit board 515 to efficiently conduct thermal energy out of each respective electronic device. As further shown in FIGS. 5A and 5B circuit board 515 may be thermally coupled to a substrate 520 with thermal interface material 523, which in some cases may be solder. In some embodiments circuit board 515 and/or substrate 520 can be a multilayer thermally conductive routing structure such as direct bonded copper (DBC) or other suitable structure such as, but not limited to an insulated metal substrate (IMS).

Substrate 520 can be thermally coupled to a chassis of a power conversion module (e.g., module 200 of FIGS. 2A and 2B, module 300 of FIG. 3), air, liquid or other suitable medium to transfer thermal energy away from semiconductor devices 510*a*-510*d*.

An insulative strip 525 may be used to electrically insulate part or all of circuit board 515 from substrate 520. In some embodiments a spring-loaded clip 530 can be attached to, for example a chassis of a power conversion module (e.g., module 200 of FIGS. 2A and 2B, module 300 of FIG. 3), and arranged to apply compressive force to semiconductor device 510*a*-510*d*, which forces circuit board 515 in thermal contact with substrate 520 which in turn holds the substrate in thermal contact with for example a chassis. Thermally conductive interface materials or other suitable materials can be used at the interfaces in these components to decrease thermal resistance between semiconductor device 510*a*-510*d* and chassis. In some embodiments an insulative cover 535 can be positioned between spring-loaded clip 530 and semiconductor device 510*a*-510*d* to provide protection and electrical isolation of circuit board 515.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as “bottom” or “top” and the like can be used to describe an element and/or feature’s relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a “bottom” surface can then be oriented “above” other elements or features. The device can be otherwise oriented (e.g., rotated 90 degrees or at other orientations) and the spatially relative descriptors used herein interpreted accordingly.

Terms “and,” “or,” and “and/or,” as used herein, may include a variety of meanings that also is expected to depend at least in part upon the context in which such terms are used. Typically, “or” if used to associate a list, such as A, B, or C, is intended to mean A, B, and C, here used in the inclusive sense, as well as A, B, or C, here used in the exclusive sense. In addition, the term “one or more” as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term “at least one of” if used to associate a list, such as A, B, or C, can be interpreted to mean any combination of A, B, and/or C, such as A, B, C, AB, AC, BC, AA, AAB, ABC, AABBCCC, etc.

Reference throughout this specification to “one example,” “an example,” “certain examples,” or “exemplary implementation” means that a particular feature, structure, or characteristic described in connection with the feature and/or example may be included in at least one feature and/or example of claimed subject matter. Thus, the appearances of the phrase “in one example,” “an example,” “in certain examples,” “in certain implementations,” or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A power converter comprising:

a housing;

a first bi-directional DC-DC converter circuit positioned within the housing and electrically coupled between an AC connector and a first DC bus wherein the AC connector is at an exterior of the housing;

a second bi-directional DC-DC converter circuit positioned within the housing and electrically coupled in between the first DC bus and a second DC bus;

a first battery connector coupled to the first DC bus and positioned at the exterior of the housing; and a second battery connector coupled to the second DC bus and positioned at the exterior of the housing.

2. The power converter of claim 1 wherein a voltage of the first DC bus is greater than a voltage of the second DC bus.

3. The power converter of claim 1 wherein the first bi-directional DC-DC converter circuit includes a first isolation transformer and wherein the second bi-directional DC-DC converter circuit includes a second isolation transformer.

4. The power converter of claim 1 wherein the first battery connector is arranged to connect to a traction battery of a vehicle and wherein the second battery connector is arranged to connect to an accessory battery of the vehicle.

5. The power converter of claim 1 further comprising an AC-DC converter circuit coupled between the AC connector and the first bi-directional DC-DC converter circuit.

6. The power converter of claim 5 wherein the AC-DC converter circuit is bi-directional, able to convert from AC to DC in a first direction and able to convert from DC to AC in a second direction that is opposite the first direction.

7. A power converter comprising:

an enclosure including an AC connector, a first battery connector and a second battery connector;

a first DC-DC converter circuit positioned within the enclosure and electrically coupled between the AC connector and a first DC bus; and a second DC-DC converter circuit positioned within the enclosure and electrically coupled in between the first DC bus and a second DC bus;

wherein the first DC bus is connected to the first battery connector;

wherein the second DC bus is connected to the second battery connector; and wherein a voltage of the first DC bus is greater than a voltage of the second DC bus.

8. The power converter of claim 7 wherein a voltage of the first DC bus is greater than a voltage of the second DC bus.

9. The power converter of claim 7 wherein the first DC-DC converter circuit is bi-directional.

10. The power converter of claim 7 wherein the second DC-DC converter circuit is bi-directional.

11. The power converter of claim 7 wherein the first DC-DC converter circuit includes a first isolation transformer and wherein the second DC-DC converter circuit includes a second isolation transformer.

12. The power converter of claim 7 wherein the first battery connector is arranged to connect to a traction battery of a vehicle and wherein the second battery connector is arranged to connect to an accessory battery of the vehicle.

13. The power converter of claim 7 further comprising an AC-DC converter coupled between the AC connector and the first DC-DC converter circuit.

14. The power converter of claim 13 wherein the AC-DC converter is bi-directional, able to convert from AC to DC in a first direction and able to convert from DC to AC in a second direction that is opposite the first direction.

15. A method of operating a power converter within a unitary enclosure, the method comprising:

converting DC power to a first DC voltage via a first bi-directional DC-DC converter and supplying the first DC voltage to a first DC bus;

supplying a first charging current to a first battery via the first DC bus;

converting the first DC voltage of the first DC bus to a second DC voltage via a second bi-directional DC-DC converter and supplying the second DC voltage to a second DC bus, wherein the second bi-directional DC-DC converter is electrically coupled in between the first DC bus and the second DC bus; and supplying a second charging current to a second battery via the second DC bus.

16. The method of claim 15 wherein the second bi-directional DC-DC converter converts the second DC voltage of the second DC bus to the first DC voltage and supplies the first DC voltage to the first DC bus.

17. The method of claim 15 wherein the first DC voltage is greater than the second DC voltage.

18. The method of claim 15 wherein the first battery is a traction battery of a vehicle and wherein the second battery is an accessory battery of the vehicle.

19. The method of claim 15 further comprising, receiving AC power at an AC connector and converting the AC power to the DC power via an AC-DC converter.

20. The method of claim 19 wherein the AC-DC converter is bi-directional.

* * * * *